United States Patent [19]
Vannatta et al.

[11] Patent Number: 5,280,644
[45] Date of Patent: Jan. 18, 1994

[54] FREQUENCY CONTROL CIRCUIT, AND ASSOCIATED METHOD, FOR A RECEIVER OPERATIVE TO RECEIVE SIGNALS-TRANSMITTED THERETO IN INTERMITTENT BURSTS

[75] Inventors: Louis J. Vannatta, Crystal Lake; Timothy P. Froehling, Palatine, both of Ill.

[73] Assignee: Motorola, Inc., Schaumburg, Ill.

[21] Appl. No.: 997,267

[22] Filed: Dec. 22, 1992

[51] Int. Cl.[5] ............................................. H04B 1/16
[52] U.S. Cl. ................................. 455/265; 455/208; 455/214; 455/259
[58] Field of Search ............... 455/208, 214, 231, 255, 455/256, 258, 263, 264, 265, 257, 258, 259, 164.1, 173.1, 182.2, 75, 192.2, 196.1; 375/97

[56] References Cited

U.S. PATENT DOCUMENTS

| | | | |
|---|---|---|---|
| 4,601,061 | 7/1986 | Carney et al. | 455/208 |
| 4,651,104 | 3/1987 | Miyo | 455/258 |
| 4,703,520 | 10/1987 | Rozanski, Jr. et al. | 455/75 |

FOREIGN PATENT DOCUMENTS 9212578  7/1992  World Int. Prop. O. ............ 375/97

Primary Examiner—Reinhard J. Eisenzopf
Assistant Examiner—Nguyen Vo
Attorney, Agent, or Firm—Robert H. Kelly

[57] ABSTRACT

A frequency control circuit, and associated method, for a receiver operative to receive a TDMA signal transmitted by a transmitter in a TDMA communication system. A first frequency detector generates a first frequency control signal. A second frequency detector, comprised of a portion of a decision-directed demodulator, generates a second frequency control signal. The first frequency control signal is utilized to effectuate frequency control when a signal is continuously received by the receiver, such as times immediately subsequent to initial powering of the receiver as the receiver becomes synchronized with the TDMA signal transmitted thereto. Onces a receiver becomes synchronized to the transmitter, the receiver need only be powered during intermittent time periods when the TDMA signal is transmitted to the receiver. The second frequency control signal is utilized to effectuate frequency control only after the receiver is synchronized with the transmitter to permit intermittent operation of the receiver, and the frequency differences between the signal transmitted to the receiver and a receiver-oscillator, oscillation frequency is less than a maximum level.

16 Claims, 3 Drawing Sheets

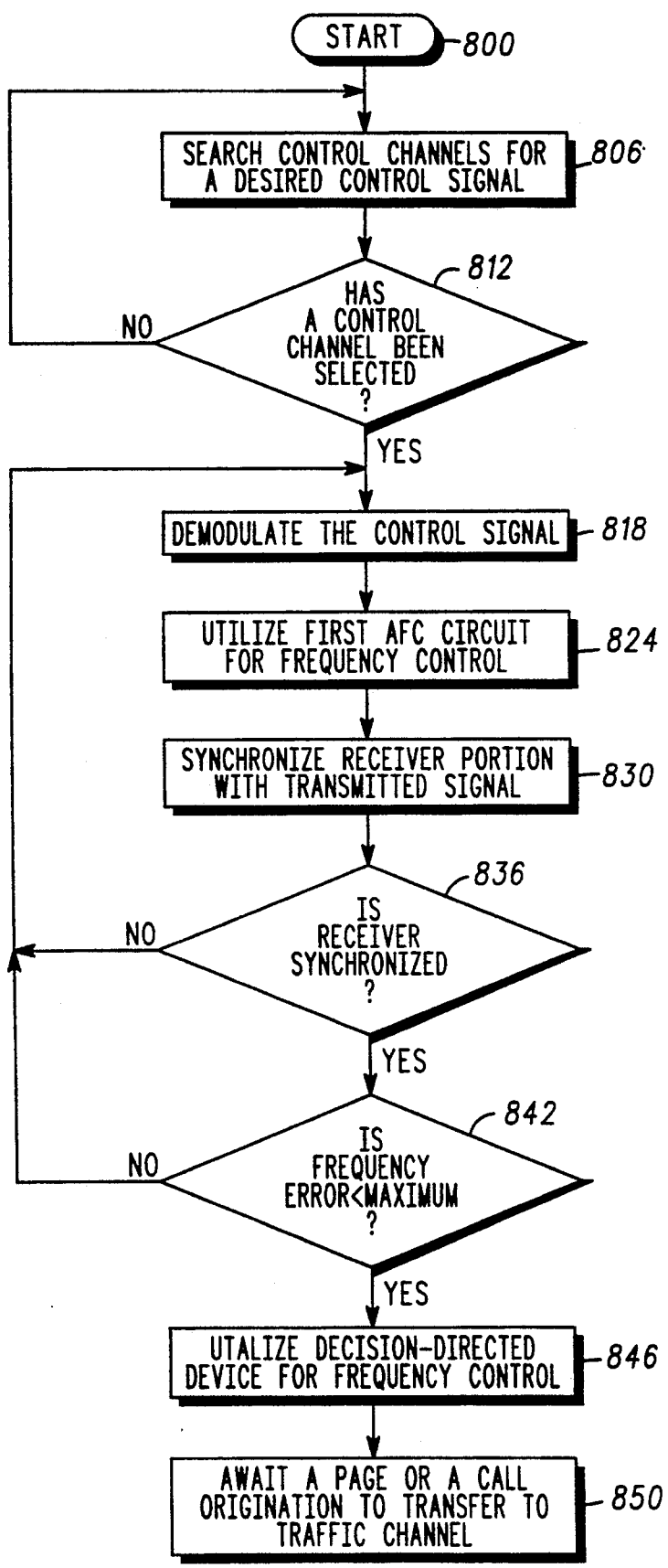

FREQUENCY CONTROL CIRCUIT, AND ASSOCIATED METHOD, FOR A RECEIVER OPERATIVE TO RECEIVE SIGNALS-TRANSMITTED THERETO IN INTERMITTENT BURSTS

BACKGROUND OF THE INVENTION

The present invention relates generally to frequency control systems and, more particularly, to a frequency control system operative in a receiver which receives signals transmitted in intermittent bursts.

A communication system is comprised, at a minimum, of a transmitter and a receiver interconnected by a communication channel. A communication signal is transmitted by the transmitter upon the transmission channel to be received by the receiver. A radio communication system is a communication system in which the transmission channel comprises a radio frequency channel defined by a range of frequencies of the electromagnetic frequency spectrum. A transmitter operative in a radio communication system must convert the communication signal into a form suitable for transmission upon the radio-frequency channel.

Conversion of the communication signal into a form suitable for transmission upon the radio-frequency channel is effectuated by a process referred to as modulation. In such a process, the communication signal is impressed upon an electromagnetic wave. The electromagnetic wave is commonly referred to as a "carrier signal." The resultant signal, once modulated by the communication signal, is commonly referred to as a modulated carrier signal. The transmitter includes circuitry operative to perform such a modulation process.

Because the modulated carrier signal may be transmitted through free space over large distances, radio communication systems are widely utilized to effectuate communication between a transmitter and a remotely-positioned receiver.

The receiver of the radio communication system which receives the modulated carrier signal contains circuitry analogous to, but operative in a manner reverse with that of, the circuitry of the transmitter and is operative to perform a process referred to as demodulation.

Numerous modulated carrier signals may be simultaneously transmitted upon differing radio frequency channels of the electromagnetic frequency spectrum. Regulatory bodies have divided portions of the electromagnetic frequency spectrum into frequency bands, and have regulated transmission of the modulated carrier signals upon various ones of the frequency bands. (Frequency bands are further divided into channels, and such channels form the radio-frequency channels of a radio communication system.)

A two-way radio communication system is a radio communication system, similar to the radio communication system above-described, but which permits both transmission and reception of a modulated carrier signal from a location and reception at such location of a modulated carrier signal. Each location of such a two-way radio communication system contains both a transmitter and a receiver. The transmitter and the receiver positioned at a single location typically comprise a unit referred to as a radio transceiver, or more simply, a transceiver.

A two-way, radio communication system which permits alternate transmission and reception of modulated carrier signals is referred to as a simplex system. A two-way radio communication system which permits simultaneous transmission and reception of communication signals is referred to as a duplex system.

A cellular communication system is one type of two-way radio communication system in which communication is permitted with a radio transceiver positioned at any location within a geographic area encompassed by the cellular communication system.

A cellular communication system is created by positioning a plurality of fixed-site radio transceivers, referred to as base stations or base sites, at spaced-apart locations throughout a geographic area. The base stations are connected to a conventional, wireline telephonic network. Associated with each base station of the plurality of base stations is a portion of the geographic area encompassed by the cellular communication system. Such portions are referred to as cells. Each of the plurality of cells is defined by one of the base stations of the plurality of base stations, and the plurality of cells together define the coverage area of the cellular communication system.

A radio transceiver, referred to in a cellular communication system as a cellular radiotelephone or, more simply, a cellular phone, positioned at any location within the coverage area of the cellular communication system, is able to communicate with a user of the conventional, wireline, telephonic network by way of a base station. Modulated carrier signals generated by the radiotelephone are transmitted to a base station, and modulated carrier signals generated by the base station are transmitted to the radiotelephone, thereby to effectuate two-way communication therebetween. (A signal received by a base station is then transmitted to a desired location of a conventional, wireline network by conventional telephony techniques. And, signals generated at a location of the wireline network are transmitted to a base station by conventional telephony techniques, thereafter to be transmitted to the radiotelephone by the base station.)

Increased usage of cellular communication systems has resulted, in some instances, in the full utilization of every available transmission channel of the frequency band allocated for cellular radiotelephone communication. As a result, various ideas have been proposed to utilize more efficiently the frequency band allocated for radiotelephone communications. By more efficiently utilizing the frequency band allocated for radiotelephone communication, the transmission capacity of an existing, cellular communication system may be increased.

The transmission capacity of the cellular communication system may be increased by minimizing the modulation spectrum of the modulated signal transmitted by a transmitter to permit thereby a greater number of modulated signals to be transmitted simultaneously. Additionally, by minimizing the amount of time required to transmit a modulated signal, a greater number of modulated signals may be sequentially transmitted.

By converting a communication signal into discrete form prior to transmission thereof, the resultant modulated signal is typically of a smaller modulation spectrum than a corresponding modulated signal comprised of a communication signal that has not been converted into discrete form. Additionally, when the communication signal is converted into discrete form prior to modulation thereof, the resultant, modulated signal may be transmitted in short bursts, and more than one modulated signal may be transmitted sequentially upon a single transmission channel.

As a single frequency channel is utilized to transmit two or more separate signals during nonoverlapping time periods, a method of signal transmission is referred to as a time division method. A communication system incorporating such a time division method of signal transmission includes a Time Division Multiple Access communication system or, more simply, a TDMA communication system.

A TDMA communication system includes a transmitter operative to transmit signals to a receiver in intermittent bursts during intermittent time periods. Such signal transmitted to a particular receiver operative in a TDMA communication system shall hereinafter be referred to as a TDMA signal.

A TDMA communication system is advantageously utilized as a cellular communication system as, during time periods in which a base station does not transmit a TDMA signal to a particular radiotelephone, another TDMA signal may be transmitted to another radiotelephone at the same frequency as the frequency at which the TDMA signal transmitted to the first radiotelephone is generated. Thus, a single base station may transmit signals to two or more radiotelephones at the same frequency. It should be noted that, typically, a base station generates signals at a particular frequency continuously, but a TDMA signal is referred to as the portions of the continuously-generated signal generated by the base station directed to a particular radiotelephone.

A receiver operative to receive a TDMA signal need only be powered during the intermittent time periods during which the TDMA signal is transmitted to the receiver. During other time periods, the receiver need not be powered. By properly synchronizing the receiver of a TDMA communication system with a transmitter which transmits the TDMA signal thereto, the receiver may be powered only during those time periods in which the TDMA signal is transmitted to the receiver, and the receiver may be turned-off (i.e. the receiver may be disconnected from a supply of power) during other time periods. Significant power savings can result as the receiver need only be powered to receive the signal transmitted thereto for one-half, or an even smaller fraction, of the time period that a receiver operable to receiver a conventional signal must be powered. (As a receiver operable to receive a conventional, continuously-generated signal must be powered continuously, a conventional receiver may not be turned-off.)

As many radiotelephones operable in a cellular communication system are powered by battery power supplies, power savings resulting from intermittent powering of the receiver portion thereof increases the amount of time in which the radiotelephone may be operated by a single power supply. As a result, a cellular communication system operable to transmit and to receive TDMA signals is also advantageous for this reason.

However, conventional frequency control circuitry which forms a portion of a receiver and which is operative to prevent frequency drift of the receiver requires a signal to be applied continuously to the frequency control circuitry for proper operation thereof. Conventional frequency control circuitry, accordingly, inadequately prevents frequency drift of a receiver which is only intermittently powered to receive a TDMA signal.

(Frequency control circuitry of a receiver compares the frequency of a signal transmitted thereto with the frequency of one or more oscillators forming a portion of the receiver. Responsive to such comparison, the oscillation frequency of the receiver-oscillator is altered.)

Receivers constructed to receive digital signals (whether transmitted only in intermittent bursts or continuously) oftentimes include decision-directed demodulators/signal detectors. Such decision-directed devices are capable of providing a frequency control signal which may be utilized by frequency control circuitry for purposes of frequency control and do not require application of a continuous signal thereto. However, such frequency control signals generated by the decision-directed devices are accurate only when the frequency of the transmitted signal is closely related in frequency with that of the receiver oscillator.

Frequency control utilizing conventional frequency control circuitry (when a continuously-generated signal is received) is operable to correct for frequency differences between a transmitted signal and the oscillation frequency of an oscillating signal generated by a receiver oscillator as great as, or even greater than, ten times the range of frequency differences over which frequency control circuitry utilizing a decision-directed device is operable. (For example, conventional frequency control circuitry is operable when the frequency differences are as great as 30 kilohertz while frequency control circuitry including the decision-directed devices is operable over frequency differences up to only approximately 3 kilohertz.)

Because of this limited range of operability, frequency control circuitry utilizing the decision-directed device cannot be utilized when the frequency differences between the signal transmitted to the receiver and the oscillation frequency of a receiver-oscillator is significant, such as immediately subsequent to initial powering of the receiver prior to effectuation of frequency control.

Accordingly, what is needed is frequency control circuitry operative in a receiver when a signal is transmitted thereto in intermittent bursts even when frequency differences between such transmitted signal and the receiver-oscillator, oscillation frequency is significant.

SUMMARY OF THE INVENTION

The present invention advantageously provides frequency control circuitry for a receiver operable to receive signals transmitted thereto in intermittent bursts.

The present invention further advantageously provides a method for maintaining the oscillation frequency of an oscillator of a receiver in a desired relationship with the frequency of a signal transmitted to the receiver in intermittent bursts.

The present invention contains further advantages and features, the details of which will become more apparent when reading the detailed description of the preferred embodiments hereinbelow.

In accordance with the present invention, therefore, a frequency control circuit for a receiver operative to receive a signal transmitted thereto in intermittent bursts is disclosed. The frequency control circuit maintains an oscillating signal defined by an oscillating frequency and generated by a receiver oscillator forming a portion of the receiver in a relative frequency relationship with the signal transmitted to the receiver. A first frequency control signal is generated. The first frequency control signal is indicative of frequency differences between a first signal representative of the signal transmitted to the receiver and a first signal representative of the oscillating signal generated by the receiver oscillator. A second frequency control signal is also generated. The second frequency control signal is indicative of frequency differences between a second signal representative of the signal transmitted to the receiver and a second signal representative of the oscillating signal generated by the receiver oscillator. The oscillation frequency of the oscillating signal of the receiver oscillator is altered responsive to values of the second frequency control signal when the receiver is synchronized with the signal transmitted thereto and the frequency differences between the first signals representative of the oscillating signal generated by the receiver oscillator and the signal transmitted to the receiver, respectively, are less than maximum values. Otherwise, the oscillation frequency of the oscillating signal of the receiver oscillator is altered responsive to the first frequency control signal.

BRIEF DESCRIPTION OF THE DRAWINGS

The present invention will be better understood when read in light of the accompanying drawings in which:

FIG. 6 is a logical flow diagram of an algorithm for executing the method of the preferred embodiment of the present invention.

DESCRIPTION OF THE PREFERRED EMBODIMENTS

Figure 1:
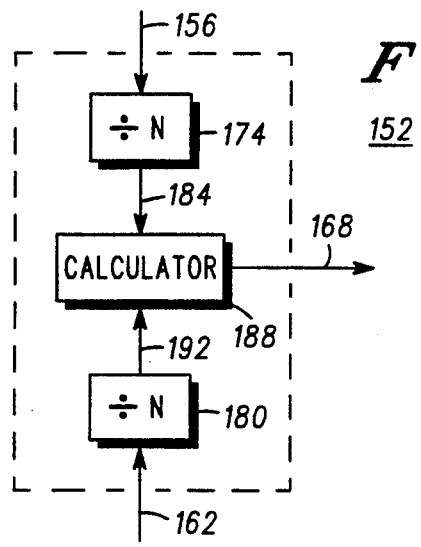
FIG. 1 is a block diagram of a frequency detector operable to determine frequency differences between two input signals applied thereto which forms a portion of the frequency control circuit of the preferred embodiment of the present invention.

Referring first to the block diagram of FIG. 1, a frequency detector, referred to generally by reference numeral 152 and comprised of the elements encompassed by the block shown in hatch, is shown. Frequency detector 152 forms a portion of the frequency control circuit of the preferred embodiment of the present invention.

Frequency detector 152 is operative to calculate differences in frequency between two signals applied thereto. A first of the signals is applied on line 156 and a second of the signals is applied on line 162. An output signal is generated on line 168 indicative of the frequency differences between the frequencies of the signals on lines 156 and 162. The signals applied on lines 156 and 162 are scaled by divider elements 174 and 180, respectively, which generate scaled signals on lines 184 and 192, respectively. The signal generated on line 184 is applied to a first input of frequency difference determiner 188, and the signal generated on line 192 is applied to a second input of frequency difference determiner 188.

Frequency difference determiner 188 is operative to compare the frequencies of the signals applied thereto and to determine the relative frequencies of such signals.

Frequency difference determiner 188 may, for example, be comprised of comparator circuitry which generates a signal of a first value on line 168 when the signal on line 184 (wherein the signal on line 184 is proportional to the signal applied on line 156) is greater in frequency than the frequency of the signal generated on line 192 (wherein the signal on line 192 is proportional to the signal applied on line 162). Conversely, when the frequency of the signal generated on line 184 is less than the frequency of the signal generated on line 192, the signal generated by frequency difference determiner 188 on line 168 is of a second value. Thus, the signal generated on line 168 is determinative of the relative frequencies of the signals applied on lines 156 and 162.

When frequency detector 152 forms a portion of a receiver circuit, and when the signal applied on line 156 is representative of a received signal received by the receiver and the signal applied on line 162 is representative of the oscillation frequency of an oscillating signal generated by a receiver-oscillator, the signal generated on line 168 may be used in a feedback-arrangement of a feedback control loop to alter the frequency of the oscillating frequency. Thereby, frequency differences between the signals applied to the frequency detector may be minimized.

When the signal generated on line 168 is of the first value, indicative of the frequency of the signal generated on line 184 being greater than the frequency of the signal generated on line 192, the oscillation frequency of the oscillating signal generated by the receiver-oscillator is caused to be adjusted upwardly. Conversely, when the signal generated on line 168 is of the second value, indicative of the frequency of the signal generated on line 192 being greater than the frequency of the signal generated on line 184, the oscillating frequency of the oscillating signal generated by the receiver-oscillator is caused to be adjusted downwardly in frequency.

Frequency detector 152 is advantageously utilized in a feedback arrangement in a frequency control circuit of a receiver to effectuate frequency control even when the magnitudes of frequency differences between the signals applied thereto vary (at least initially) by relatively significant values. But frequency detector 152 must continuously receive signals on lines 156 and 162 to ensure that the signal generated on line 168 is accurate.

Figure 2:
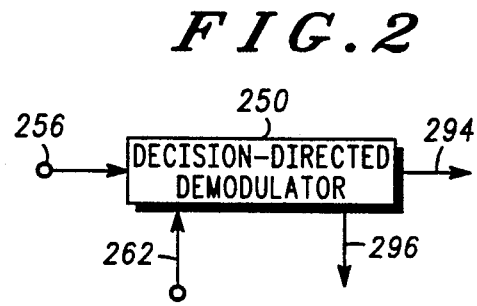
FIG. 2 is a block diagram of a decision-directed demodulator operable, in part, to determine frequency differences between two input signals applied thereto and which also forms a portion of the frequency control circuit of the preferred embodiment of the present invention.

Turning next to the block diagram of FIG. 2, a decision-directed demodulator, referred to by reference numeral 250, is shown in block form. Demodulator 250 also forms a portion of the frequency control circuit of the preferred embodiment of the present invention. Decision-directed demodulator 250 is operative to demodulate a digital signal applied thereto on line 256. A signal representative of an oscillating signal generated by a receiver-oscillator on line 262 is also applied to demodulator. Demodulator 250 generates a demodulated signal on line 294 indicative of the signal applied to the demodulator on line 256. Decision-directed demodulators, such as demodulator 250, are typically comprised of one or more integrated circuits such as a circuit referred to as an ASIC. Such a decision-directed demodulator is further operative to generate a frequency control signal at an output thereof, here coupled to line 296, responsive to a comparison of the frequencies of the signals applied thereto on lines 256 and 262.

As the signal generated on line 296 is similar in content with that of the signal generated on line 168 by frequency detector 168 of FIG. 1, such signal may be utilized in a manner analogous to the manner in which the signal generated on line 168 is utilized in a feedback-arrangement in a feedback control loop, thereby similarly to maintain the frequency of the signal applied on line 262 in a desired frequency relationship with the signal applied on line 256.

As demodulator 250 is operative to demodulate a digital signal, such demodulator may be utilized to demodulate a TDMA signal applied to the demodulator in only intermittent bursts during intermittent time periods. However, such a demodulator, as noted hereinabove, is operative to provide an accurate determination of frequency differences between the signals applied thereto on lines 256 and 262 only when the frequency differences between the two signals are not significant.

While frequency detector 152 of FIG. 1 is operative to provide accurate indications of frequency differences between the signals applied thereto when such frequency differences are greater in magnitude than the magnitude of frequency differences over which demodulator 250 is operable, frequency detector 152 must continuously receive a signal on line 156 to operate properly in a feedback control loop, frequency detector 152 does not function properly when the signal applied thereto on line 156 is comprised of a TDMA signal. Conversely, while demodulator 250 is only operative to provide accurate indications of frequency differences between the signals applied thereto when such frequency differences are relatively small in magnitude, the demodulator is operative to generate a frequency control signal when the signal applied thereto is comprised of a TDMA signal applied during only intermittent time periods.

Hence, while neither frequency detector 152 nor decision-directed demodulator 250, when used alone, is operable to perform adequately as a portion of a frequency control loop, the preferred embodiment of the present invention makes use of the advantageous operational features of both frequency detector 152 and decision-directed demodulator 250 to form a frequency control circuit operable in a receiver which receives a TDMA signal and which does not require initial, significant frequency correspondence between the signal transmitted to the receiver and the oscillation frequency of the receiver-oscillator for adequate operation of the frequency control circuit.

Figure 3:
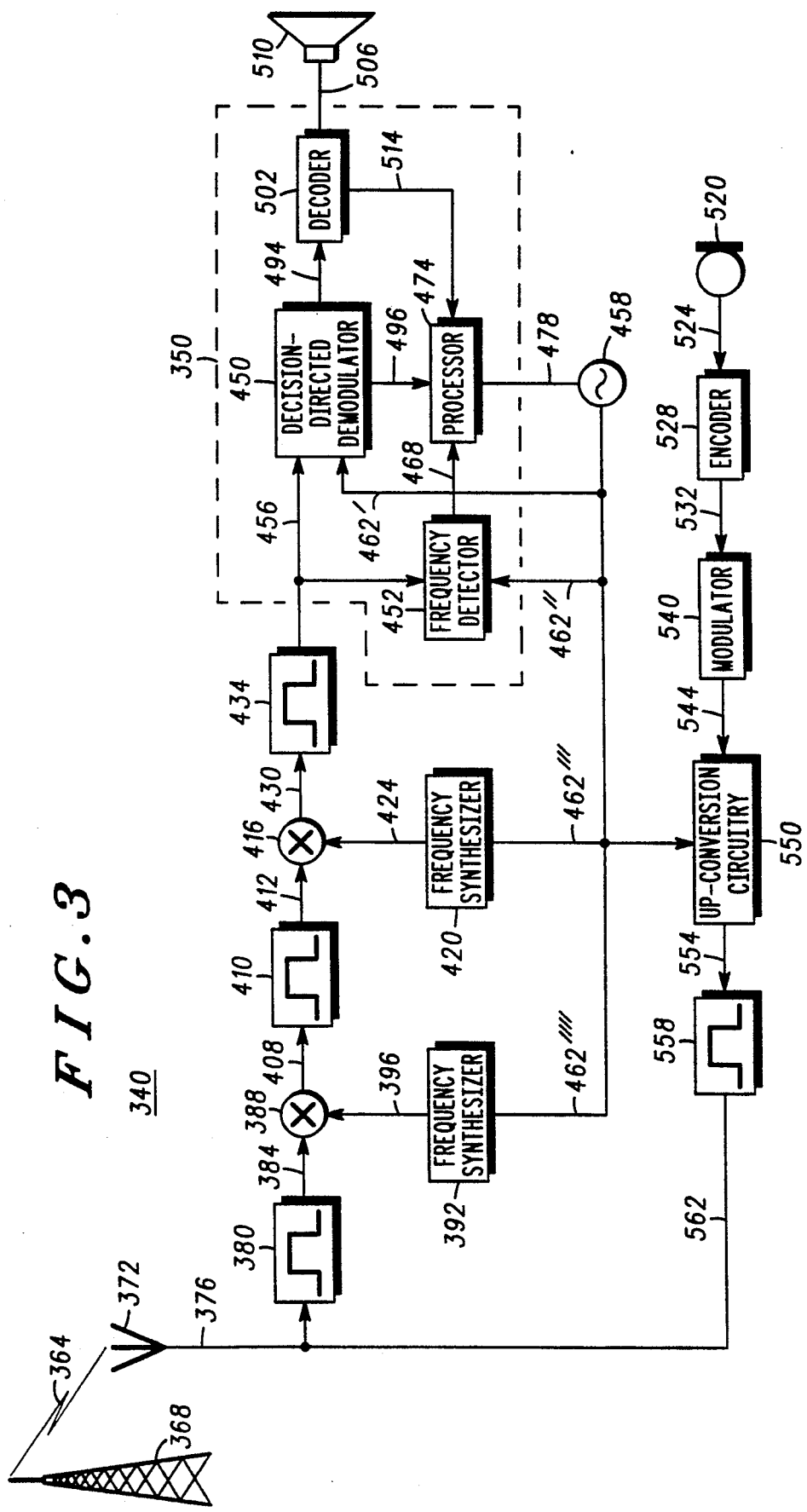
FIG. 3 is a block diagram of a transceiver having a receiver portion which includes the frequency control circuit of the preferred embodiment of the present invention.

FIG. 3 is a block diagram of a radio transceiver, referred to generally by reference numeral 340, of a preferred embodiment of the present invention. Radio transceiver 340 includes a receiver portion having a frequency control circuit for maintaining the oscillation frequency of a receiver-oscillator of the transceiver 340 in a frequency relationship with the frequency of a signal transmitted to the transceiver. The frequency control circuit is operable to maintain the transceiver in the desired frequency relationship with the signal transmitted to the transceiver even when the signal transmitted to the transceiver is a TDMA signal and the receiver portion of the transceiver is operational only during the intermittent time periods during which the TDMA signal is received by the receiver.

The frequency control circuit of the preferred embodiment of the present invention includes circuit elements analogous to elements comprising frequency detector 152 of FIG. 1 and decision-directed demodulator 250 of FIG. 2. The frequency control circuit of the preferred embodiment of the present invention is referred to generally by reference numeral 350 and is comprised of the elements within the block shown in hatch of the receiver portion of transceiver 340.

Signal 364 transmitted by transmitter 368 is received by antenna 372 of transceiver 340. Antenna 372 converts the received signal into an electrical signal on line 376 which is applied to filter 380. Filter 380 filters the signal applied thereto and generates a filtered signal on line 384.

The signal generated on line 384 is applied to a first input of mixer 388. A down-mixing signal generated by programmable frequency synthesizer 392 on line 396 is applied to a second input of mixer 388. Mixer 388 mixes the two signals applied thereto on lines 384 and 396, and generates a first down-converted signal on line 408.

The signal generated on line 408 is applied to filter 410. Filter 410 filters the signal applied thereto and generates a filtered signal on line 412.

Line 412 is coupled to a first input of mixer 416. An oscillating signal generated by programmable frequency synthesizer 420 is applied on line 424 to a second input of mixer 416. Mixer 416 mixes the two signals applied thereto on lines 412 and 424 and generates a second, down-mixed signal on line 430. Line 430 is coupled to an input of filter 434 to apply the second, down-mixed signal thereto. Filter 434 is operative to filter the signal applied thereto and to generate a filtered signal which is applied to decision-directed demodulator 450 by way of line 456.

Frequency detector 452 is also coupled to receive the filtered signal generated by filter 434 on line 456. Frequency detector 452 is analogous to frequency detector 152 of FIG. 1.

Reference oscillator 458 generates an oscillating signal on line 462. Signals representative of the oscillating signal generated by reference oscillator 458 are applied to decision directed demodulator 450 by way of line 462', to frequency detector 452 by way of line 462'', to programmable synthesizer 420 by way of line 462''', and to programmable synthesizer 392 by way of line 462''''. While the signals representative of the oscillating signal generated by reference oscillator 458 are applied to frequency synthesizers 392 and 420 to maintain the oscillating frequency of the oscillating signals generated therefrom in a frequency relationship with the oscillating frequency of the oscillating signal generated by reference oscillator 458, the signals applied to decision-directed detector 450 and frequency detector 452 by way of lines 462' and 462'' are utilized to generate frequency control signals analogous to frequency control signals generated on lines 168 and 296 by frequency detector 152 and demodulator 250, respectively, of FIGS. 1 and 2.

Frequency detector 452 is operative to determine frequency differences between the signals applied thereto on lines 456 and 462'', respectively. An indication of such frequency difference is generated on line 468. Line 468 is coupled to an input of processor 474. An output signal generated by processor 474 is applied to reference oscillator 458 by way of line 478. The output signal generated by processor 474 is operative to alter the oscillation frequency of the oscillating signal generated by reference oscillator 458. Such alteration is sometimes referred to as warping of the oscillator, and the signal generated by processor 474 is referred to as an oscillator warp signal.

Decision-directed demodulator 450 is operative to demodulate the signal applied thereto on line 456 and to generate a demodulated signal on line 494. Decision-directed demodulator 450 is further operative to determine frequency differences between the signals applied thereto on lines 456 and 462'. A signal indicative of such frequency differences is generated on line 496 which is applied to an input of processor 474. Analogous to operation of processor 474 to generate an output signal on line 478 to alter the oscillation frequency of the oscillating signal generated by reference oscillator 458 responsive to the value of the signal generated on line 468 by frequency detector 452, processor 474 is alternately operable to generate the output signal on line 478 responsive to the value of the signal generated on line 496.

The demodulated signal generated by decision-directed demodulator 450 on line 494 is applied to decoder 502. Decoder 502 is operative to decode the signal applied thereto and to generate a decoded signal on line 506 which is applied to a transducer, here speaker 510. Decoder 502 is further operative to generate a signal on line 514 during times in which the decoder 502 is operative to decode accurately the demodulated signal applied thereto. When signal 364 transmitted to transceiver 340 comprises a TDMA signal, decoder 502 is only able to decode accurately the demodulated signal applied thereto on line 494 when the receiver portion of transceiver 340 is synchronized with the TDMA signal transmitted thereto. Hence, the signal generated on line 514 is indicative of times in which the receiver portion of transceiver 340 is in synchronization with the signal transmitted to transceiver 340. Line 514 is coupled to another input of processor 474.

Elements of radio transceiver 340 shown at a bottom portion of FIG. 3 comprise the transmitter portion of transceiver 340. A transducer, here microphone 520 converts a signal applied thereto into electrical form on line 524. Line 524 is applied to an input of encoder 528. Encoder 528 encodes the signal applied thereto and generates an encoded signal on line 532 which is applied to modulator 540. Modulator 540 is operative to modulate the signal applied thereto and to generate a modulated signal on line 544. Line 544 is coupled to an input of up-conversion circuitry 550. Signals representative of the oscillating signal generated by reference oscillator 458 are applied to another input of up-conversion circuitry 550. Up-conversion circuitry 550 is operative to convert upward in frequency the modulated signal applied thereto on line 544 and to generate an up-converted signal on line 554. Line 554 is coupled to an input of filter 558 which filters the signal applied thereto and generates a filtered signal on line 562 which is coupled to antenna 372 whereat a signal may be transmitted therefrom.

Frequency control circuit 350 of radio transceiver 340 is operative to maintain the oscillation frequency of an oscillating signal generated by reference oscillator 458 in a desired frequency relationship with the frequency of signal 364 transmitted to transceiver 340 even when signal 364 comprises a TDMA signal. Once frequency control has initially been established and the receiver portion becomes synchronized with the signal transmitted thereto, significant portions of the receiver portion of transceiver 340 may be turned-off and only intermittently powered during the intermittent time periods during which the TDMA signal comprising signal 364 is transmitted to transceiver 340.

Operation of frequency control circuit 350 takes advantage of the characteristics of a TDMA transmission system. While a TDMA signal is transmitted to a receiver in intermittent bursts during only intermittent time periods, during time periods in which the TDMA signal is not transmitted to transceiver 340, other TDMA signals are transmitted to other transceivers. In effect, although a TDMA signal is transmitted to transceiver 340 during only the intermittent time intervals, a signal is actually transmitted at a particular frequency continuously. When receiver portion of transceiver 340 is initially powered to receive a TDMA signal, the component elements of the receiver are powered continuously until the receiver portion of the transceiver becomes synchronized with the TDMA signal transmitted to the transceiver.

During such time, signals transmitted by transmitter 368 are received by the receiver portion of transceiver 340. And, also during such time, frequency detector 452, analogous to frequency detector 152 of FIG. 1, is operable to generate a frequency control signal on line 468 indicative of frequency differences between the frequency of the signal received by the receiver portion of transceiver 340 and the oscillation frequency of the oscillating signal generated by reference oscillator 458. Because frequency detector 452 is operable even when frequency differences between the two signals are significant, utilization by processor 474 of the frequency control signal generated by frequency detector 452 permits frequency control of the oscillating signal generated by reference oscillator 458.

When the receiver portion of transceiver 340 becomes synchronized with the TDMA signal transmitted to transceiver 340, an indication of such synchronization is supplied to processor 474 by decoder 502 on line 514. If frequency control has been effectuated by utilization of the frequency control signal generated on line 468 by frequency detector 452, frequency differences between the frequencies of the signals applied to decision-directed demodulator 450 on lines 456 and 462' are of a low magnitude, and demodulator 450 is operative to generate an accurate indication of frequency differences between the two signals on line 496. At such time, processor 474 generates the output signal on line 478 to alter the frequency of the oscillating signal generated by reference oscillator 458 responsive to the value of the signal generated by demodulator 450 on line 496. As demodulator 450 does not require continuous application of a signal thereto to obtain an accurate indication of frequency differences between the oscillation frequency of the reference oscillator and the received signal, elements of the receiver portion of transceiver 340 may be turned-off and powered only during times in which a TDMA signal is transmitted to transceiver 340. In such manner, frequency control of the reference oscillator 458 may be effectuated and thereafter maintained.

Figure 4:
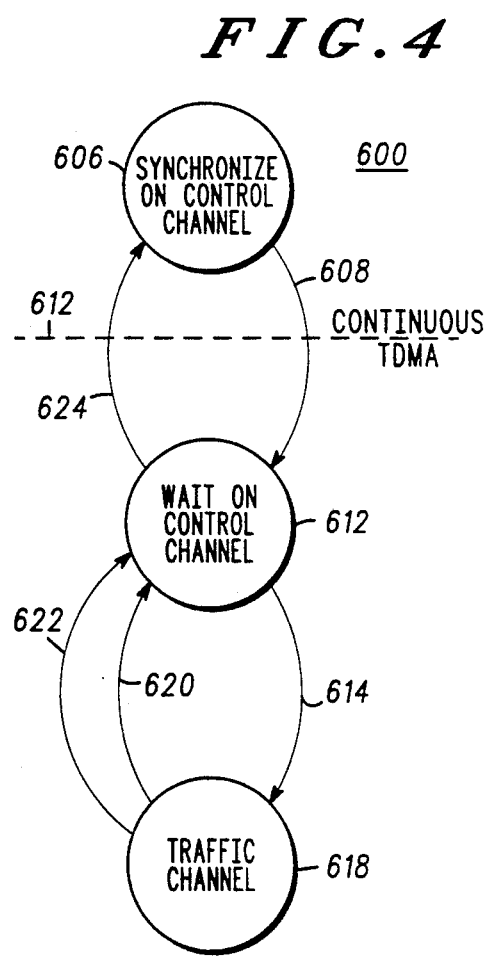
FIG. 4 is a state diagram which illustrates the method of operation of the method of the preferred embodiment of the present invention.

Turning next to FIG. 4, a state diagram, referred to generally by reference numeral 600, is shown. State diagram 600 illustrates the method of operation of the frequency control circuit of the preferred embodiment of the present invention when embodied in a radiotelephone operable in a cellular communication system utilizing a TDMA transmission method. In general, a radiotelephone operable in such a system is initially tuned to one of a preselected group of control channels upon which control signals are generated and transmitted by a base site. Such control signals permit the radiotelephone to become synchronized with the base site. Such state is indicated in the figure by state 606. After a control channel has been selected, until the radiotelephone becomes synchronized with the base station, the elements of the receiver portion of the radiotelephone remain continuously powered; such continuous powering of the elements of the receiver portion of the radiotelephone occurs during all states of state diagram 600 located above line 612. (Only state 606 is above line 612.)

Once synchronization between the radiotelephone and the base site has been attained, the elements of the receiver portion of the radiotelephone need not be continuously powered and the elements of the receiver portion of the radiotelephone need only be powered during the time periods during which the TDMA signal is transmitted to the radiotelephone. In the figure, such change in state is indicated by line 608, such subsequent state of operation is indicated by state 612. When in such state of operation, the radiotelephone remains tuned to the control channel whereat the radiotelephone awaits transmission of a call (i.e., a "page") or generation of a transmitted signal by the transmitter portion of the radiotelephone (i.e., an "origination").

When a page or an origination is initiated, the radiotelephone is tuned to a traffic channel whereat TDMA signals are transmitted and received by the radiotelephone. Such change in state is indicated by line 614, and such new state is indicated in state diagram 600 by state 618. The radiotelephone remains upon the traffic channel until the call is terminated either by the radiotelephone or by the base site. Call termination may occur either as a result of completion of communication or as a result of channel transmission difficulties. Accordingly, two lines, 620 and 622 extending between state 618 and 612 to represent the two scenarios. In either scenario, the radiotelephone becomes tuned to a control channel. If transmission difficulties have also caused the loss of a control signal transmitted from the base station to the radiotelephone, synchronization between the base station and the radiotelephone is lost, and the radiotelephone returns to continuous operation of state 606. Such state transition is indicated by line 624 extending between state 612 and 606.

Figure 5:
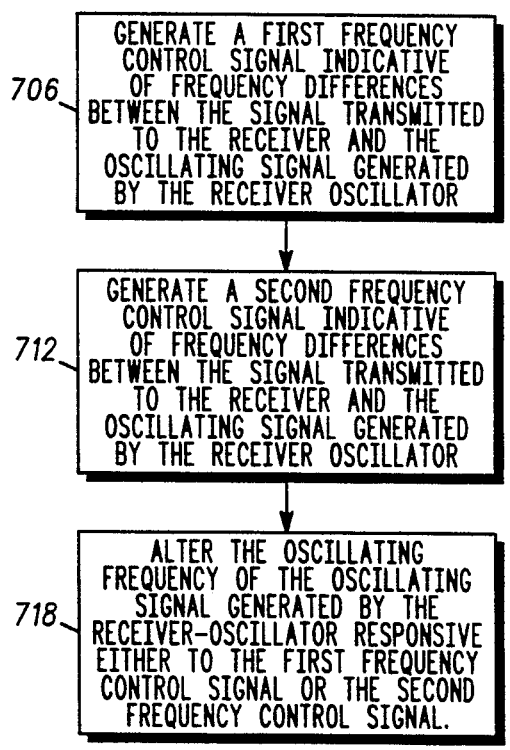
FIG. 5 is a flow diagram listing the method steps of the preferred embodiment of the present invention.

FIG. 5 is a flow diagram which lists the method steps of the method, referred to generally by reference numeral 700, of the preferred embodiment of the present invention. The method maintains an oscillating signal defined by an oscillation frequency and generated by a receiver-oscillator forming a portion of a receiver operative to receive a signal transmitted thereto in intermittent bursts in a relative frequency relationship with the signal transmitted to the receiver.

First, and as indicated by block 706, a first frequency control signal is generated indicative of frequency differences between the signal transmitted to the receiver and the oscillating signal generated by the receiver-oscillator.

Next, and as indicated by block 712, a second frequency control signal is generated which is indicative of frequency differences between the signal transmitted to the receiver and the oscillating signal generated by the receiver-oscillator.

Next, and as indicated by block 718, the oscillation frequency of the oscillating signal of the receiver-oscillator is altered responsive to values of the second frequency control signal when the receiver is synchronized with the signal transmitted thereto and the frequency differences between the oscillating signal generated by the receiver-oscillator and the signal transmitted to the receiver are less than maximum values. Otherwise, the oscillation frequency is altered responsive to the first frequency control signal.

Turning finally to the flow diagram of FIG. 6, an algorithm utilized to effectuate the method of the preferred embodiment of the present invention for a radiotelephone operable in a cellular communication system is shown. The program may be embodied in processor circuitry, such as processor 474 of transceiver 340 of FIG. 3.

First, after entry into the algorithm, as indicated by start block 800, the radiotelephone searches through various preselected control channels for a desired control signal, as indicated by block 806. At decision block 812, a determination is made as to whether a control channel has been selected. If not, the no branch is taken and searching of control channels continues. If a control channel has been selected, the yes branch is taken and the control signal generated on the control channel is demodulated, as indicated by block 818, the first frequency control circuit (e.g., frequency detector 452 of transceiver 340 of FIG. 3) is utilized to effectuate frequency control, as indicated by block 824, and the radiotelephone is synchronized with the signal transmitted to the radiotelephone, as indicated by block 830.

A determination is then made, as indicated by decision block 836, as to whether the radiotelephone is synchronized with the signal transmitted thereto on the control channel. If not, synchronization between the radiotelephone and the transmitted signal continues. If the receiver is in synchronization with the transmitted signal, the yes branch is taken and a determination is made as indicated by decision block 842, as to whether the frequency error between the transmitted signal and the oscillation frequency of the oscillating signal generated by the radiotelephone reference oscillator is less than a maximum level. If not, the no branch is taken and frequency control utilizing frequency detector 452 continues. If the frequency error is less than the maximum level, the yes branch is taken, and frequency control is effectuated by a decision-directed device, such as demodulator 450 of transceiver 340. Thereafter, the radiotelephone awaits a page or call origination, as indicated by block 850, whereat the radiotelephone is thereafter tuned to traffic channels to transmit and to receive signals.

Because the frequency control circuit of the preferred embodiment of the present invention permits frequency control to be effectuated both when frequency differences between a signal transmitted to a receiver and the oscillation frequency generated by a receiver-oscillator varies significantly and also when a TDMA signal is transmitted to a receiver incorporating such frequency control circuit, problems associated with frequency control circuits of the existing art are avoided.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A frequency control circuit for a receiver operative to receive a signal transmitted thereto in intermittent bursts, said frequency control circuit for maintaining an oscillating signal defined by an oscillation frequency and generated by a receiver oscillator forming a portion of the receiver in a relative frequency relationship with the signal transmitted to the receiver, said frequency control circuit comprising:

means for generating a first frequency control signal coupled to receive a first signal representative of the signal transmitted to the receiver and a first signal representative of the oscillating signal generated by the receiver oscillator, wherein the first frequency control signal generated by said means for generating the first frequency control signal is indicative of frequency differences between the first signal representative of the signal transmitted to the receiver and the first signal representative of the oscillating signal generated by the receiver oscillator;

means for generating a second frequency control signal coupled to receive a second signal representative of the signal transmitted to the receiver and a second signal representative of the oscillating signal generated by the receiver oscillator, wherein the second frequency control signal generated by said means for generating the second frequency control signal is indicative of frequency differences between the second signal representative of the signal transmitted to the receiver and the second signal representative of the oscillating signal generated by the receiver oscillator;

means for determining when the receiver is in time-synchronization with the signal transmitted to the receiver, said means for determining coupled to receive a third signal representative of the signal transmitted to the receiver and operative to generate a synchronization signal of a first signal level when the receiver is in time-synchronization with the signal transmitted thereto; and means for altering the oscillation frequency of the oscillating signal of the receiver oscillator coupled to receive the first frequency control signal and the second frequency control signal generated by the means for generating the first frequency control signal and the second frequency control signal, respectively, said means for altering operative responsive to values of the second frequency control signal when the means for determining generates the synchronization signal of the first signal level and the frequency differences between the first signals representative of the oscillating signal generated by the receiver oscillator and the signal transmitted to the receiver, respectively, are within a selected range and, otherwise, responsive to the first frequency control signal.

2. The frequency control circuit of claim 1 wherein said means for generating the first frequency control signal comprises a frequency detector having a first input and a second input wherein the first signal representative of the signal transmitted to the receiver is applied to the first input thereof and the first signal representative of the oscillating signal generated by the receiver oscillator is applied to the second input thereof.

3. The frequency control circuit of claim 1 wherein said means for generating the second control signal comprises a digital demodulation circuit having a first input and a second input, wherein the second signal representative of the signal transmitted to the receiver is applied to the first input thereof and the second signal representative of the oscillating signal generated by the receiver oscillator is applied to a second input thereof.

4. The frequency control circuit of claim 3 wherein said means for determining when the receiver is in time-synchronization comprises a digital signal decoder circuit coupled to receive a demodulated signal generated by said digital demodulation circuit.

5. The frequency control circuit of claim 1 wherein the first signal representative of the oscillating signal generated by the receiver oscillator and the second signal representative of the oscillating signal generated by the receiver oscillator are of similar signal characteristics.

6. The frequency control circuit of claim 1 wherein the first signal representative of the signal transmitted to the receiver and the second signal representative of the signal transmitted to the receiver are of similar signal characteristics.

7. The frequency control circuit of claim 1 wherein said means for altering the oscillation frequency comprises a processor having a first input coupled to receive the first frequency control signal, a second input coupled to receive the second frequency control signal, a third input coupled to receive the synchronization signal generated by the means for determining, and a first output whereat an oscillator-warp signal is generated for application to the receiver oscillator to alter the oscillation frequency of the oscillating signal generated thereat responsive to values of the oscillator-warp signal.

8. The frequency control circuit of claim 7 further comprising an algorithm embodied in the processor and operable to: generate said oscillator-warp signal at the first output of the processor responsive to values of the second frequency control signal when the synchronization signal applied to the third input is of the first signal level indicating that the receiver is in synchronization with the signal transmitted to the receiver and the frequency differences between the first signals representative of the oscillating signal generated by the receiver oscillator and the signal transmitted to the receiver, respectively, are within the selected range and, otherwise, responsive to the first frequency control signal.

9. A method for a receiver operative to receive a signal transmitted thereto in intermittent bursts, said method for maintaining an oscillating signal defined by an oscillation frequency and generated by a receiver oscillator forming a portion of the receiver in a relative frequency relationship with the signal transmitted thereto in the intermittent bursts, said method comprising the steps of:

generating a first frequency control signal indicative of frequency differences between a first signal representative of the signal transmitted to the receiver and a first signal representative of the oscillating signal generated by the receiver oscillator;

generating a second frequency control signal indicative of frequency differences between a second signal representative of the signal transmitted to the receiver and a second signal representative of the oscillating signal generated by the receiver oscillator; and altering the oscillation frequency of the oscillating signal of the receiver oscillator responsive to values of the second frequency control signal when the receiver is synchronized with the signal transmitted thereto and the frequency differences between the first signals representative of the oscillating signal generated by the receiver oscillator and the signal transmitted to the receiver, respectively, are within a selected range and, otherwise, responsive to the first frequency control signal.

10. The method of claim 9 wherein said step of generating the first frequency control signal comprises applying the first signal representative of the signal transmitted to the receiver to a first input of a frequency detector, applying the first signal representative of the oscillating signal generated by the receiver oscillator to a second input of the frequency detector, and calculating frequency differences between the signals applied to the first and second inputs, respectively, of the frequency detector.

11. The method of claim 9 wherein said step of generating the second frequency control signal comprises the steps of: applying the second signal representative of the signal transmitted to the receiver to a first input of a digital demodulation circuit, applying the second signal representative of the oscillating signal generated by the receiver oscillator to a second input of the digital demodulation circuit, and calculating frequency differences between the signals applied to the first and second inputs, respectively, of the digital demodulation circuit.

12. The method of claim 11 comprising the further step of generating a synchronization signal of a first signal level indicative of times during which the receiver is in synchronization with the signal transmitted to the receiver.

13. The method of claim 12 wherein said step of altering the oscillation frequency of the oscillating signal generated by the receiver oscillator comprises the steps of: applying the first frequency control signal to a first input of a processor, applying the second frequency control signal to a second input of the processor, and generating an oscillator-warp signal at a first output of the processor for application to the receiver oscillator to alter the oscillation frequency of the oscillating signal generated thereat responsive to values of the oscillator-warp signal.

14. The method of claim 13 comprising the further step of applying the synchronization signal to a third input of the processor.

15. The method of claim 13 wherein the oscillator-warp signal generated during said step of generating the oscillator-warp signal is generated responsive to values of the second frequency control signal when the synchronization signal is of the first signal level indicating that the receiver is in synchronization with the signal transmitted to the receiver is applied to the third input and the frequency differences between the first signals representative of the oscillating signal generated by the receiver oscillator and the signal transmitted to the receiver, respectively, are within a selected range and, otherwise, responsive to the first frequency control signal.

16. In a receiver having receiver circuitry operative to receive a signal transmitted thereto in intermittent bursts, a combination with the receiver circuitry of a frequency control circuit for maintaining an oscillating frequency of an oscillating signal generated by a receiver oscillator forming a portion of the receiver circuitry in a relative frequency relationship with the signal transmitted to the receiver, said frequency control circuit comprising:

a first frequency detector having a first input and a second input, wherein said first input thereof is coupled to receive a first signal representative of the signal transmitted to the receiver and the second input thereof is coupled to receive a first signal representative of the oscillating signal generated by the oscillator, the first frequency detector comparing frequency magnitudes of the signals received at the first and second inputs, respectively, thereof and for generating a first frequency control signal representative of frequency magnitude differences therebetween;

a decision-directed demodulator having a first input and a second input, wherein said first input thereof is coupled to receive a second signal representative of the signal transmitted to the receiver and the second input thereof is coupled to receive a second signal representative of the oscillating signal generated by the oscillator, the decision-directed demodulator comparing frequency magnitudes of the signals received at the first and second inputs, respectively, thereof and for generating a second frequency control signal representative of frequency magnitude differences therebetween;

a digital signal decoder circuit having a first input coupled to receive a third signal representative of the signal transmitted to the receiver, said digital signal decoder circuit operative to generate a synchronization signal of a first signal level when the receiver is in time-synchronization with the signal transmitted thereto; and processing circuitry having inputs for receiving the first control signal the second control signal, and the synchronization signal and an output coupled to the oscillator, said processing circuitry for generating an oscillator-warp signal at the output thereof responsive to values of the second frequency control signal when the synchronization signal is of the first signal level and the frequency differences between the first signals representative of the oscillating signal generated by the receiver oscillator and the signal transmitted to the receiver, respectively, are within a selected range and, otherwise, responsive to the first frequency control signal.

* * * * *